United States Patent [19]
Binnig et al.

[11] Patent Number: 6,157,114
[45] Date of Patent: Dec. 5, 2000

[54] MECHANICAL SIGNAL PROCESSOR COMPRISING MEANS FOR LOSS COMPENSATION

[75] Inventors: Gerd K. Binnig, Wollerau; Urs T. Dürig, Rüschlikon; Walter Häberle, Wädenswil, all of Switzerland

[73] Assignee: International Business Machines Corporation, Armonk, N.Y.

[21] Appl. No.: 09/254,934

[22] PCT Filed: Jul. 3, 1996

[86] PCT No.: PCT/IB96/00636

§ 371 Date: Mar. 17, 1999

§ 102(e) Date: Mar. 17, 1999

[87] PCT Pub. No.: WO98/01948

PCT Pub. Date: Jan. 15, 1998

[51] Int. Cl.[7] .................................................. H01L 41/08
[52] U.S. Cl. ......................... 310/321; 310/331; 310/334
[58] Field of Search ................................. 310/321–324, 310/330–332, 334; 333/197, 198; 73/35, 71, 649, 651, 655, 679, 777, 778

[56] References Cited

U.S. PATENT DOCUMENTS

| | | | |
|---|---|---|---|
| 3,290,621 | 12/1966 | Krambeer et al. | 333/71 |
| 3,376,522 | 4/1968 | Traub | 333/71 |
| 3,488,530 | 1/1970 | Staudte | 310/330 |
| 3,501,745 | 3/1970 | Beckman | 310/321 X |
| 3,686,593 | 8/1972 | Zakaria | 310/321 X |
| 4,305,298 | 12/1981 | Greenwood | 73/651 |
| 4,373,396 | 2/1983 | Johnson | 73/651 |
| 4,517,486 | 5/1985 | Andrews | 310/331 |
| 4,764,244 | 8/1988 | Chitty et al. | 310/321 X |
| 5,049,775 | 9/1991 | Smits | 310/331 X |
| 5,998,911 | 12/1999 | Kikuchi et al. | 310/321 X |

FOREIGN PATENT DOCUMENTS

| | | |
|---|---|---|
| 1153825 | 5/1969 | United Kingdom . |
| 94-30030 | 12/1994 | WIPO . |

OTHER PUBLICATIONS

Sensors & Actuators, vol. 17 No. 3/04 (May 1, 1989) pp 513–519. "Resonating Silicon Beam Force Sensor".

*Primary Examiner*—Mark O. Budd
*Attorney, Agent, or Firm*—McGinn & Gibb, P.C.

[57] ABSTRACT

A micromechanical signal processing system includes an oscillating member designed to oscillate at a first frequency, a micromechanical pump oscillator being driven so as to oscillate at a second frequency, with the second frequency being greater than the first frequency, and a non-linear coupling element to couple the micromechanical pump oscillator to the oscillating member. These elements are arranged such that energy from the micromechanical pump oscillator is transferred via said non-linear coupling element into the oscillating member to compensate for its losses if the oscillating member oscillates at the first frequency.

13 Claims, 6 Drawing Sheets

MECHANICAL SIGNAL PROCESSOR COMPRISING MEANS FOR LOSS COMPENSATION

TECHNICAL FIELD

The present invention relates to micromechanical signal processors comprising means for loss compensation.

BACKGROUND OF THE INVENTION

There is a demand for sensors, detectors and signal processing systems of small size.

Micromechanical elements are suited to realize such systems. Conventional, micromechanical systems are rather simple and their capabilities are not overwhelming. So far, the physics of larger systems has been transferred into devices of smaller size as a simple process of miniaturization. In the co-pending patent application PCTIIB 95/00817, with title "Mechanical Signal Processor Based on Micromechanical Oscillators and Intelligent Acoustic Detectors and Systems Based Thereon", for the first time a micromechanical AND gate was addressed, which broke new grounds in micromechanics. Such an AND gate may serve as basic building block for many different kinds of micromechanical signal processing systems, including microphones, acoustic and tactile sensors and the like.

Since all mechanical systems are subject to losses of different nature, micromechanical building blocks are required which compensate such losses, and, if needed, provide for amplification. A complex micromechanical acoustic sensor, for example, which comprises several levels of oscillating cantilevers being mechanically coupled would run dead without having special means to compensate for losses.

It is thus an object of the present invention to provide a method and apparatus compensating losses in a micromechanical system.

It is an object of the present invention to provide a method and apparatus which compensates losses in micromechanical systems comprising oscillating cantilevers.

It is an object of the present invention to provide a method and apparatus which improves known micromechanical signal processing systems.

SUMMARY OF THE INVENTION

This has been achieved by the provision of a mechanical pump oscillator being coupled to a micromechanical system in a manner that energy from the pump oscillator is transferred into the micromechanical system to compensate for losses.

The basic building block of the present invention is an oscillating member—oscillating at a frequency f3—whose losses are compensated by means of a micromechanical pump oscillator driven to oscillate at a frequency fp (with fp>f3) and transferring energy into the oscillating member via a non-linear coupling element. Depending on the particular embodiment, in addition to the pump oscillator, an idle oscillator is needed. This idle oscillator is also coupled to said oscillating member and oscillates at a frequency fi=fp−f3.

The above basic building block can be used to obtain a micromechanical AND gate with loss compensation. Such an AND gate comprises a first cantilever oscillating at a frequency f1 and a second cantilever oscillating at a frequency f2. These two cantilevers are coupled by means of a linear coupling element such that a linear superposition of the oscillations at frequencies f1 and f2 takes place. The oscillating member of the above basic building block is coupled to the two cantilevers via a non-linear coupling element such that its resonance frequency f3 is stimulated if the first of said cantilevers oscillates at f1 and the second of said cantilevers oscillates at f2. Said oscillating member, as described above, is coupled to a pump oscillator such that its losses are compensated, or, if needed, its oscillation even is amplified.

Based on such an AND gate, many different kinds of micromechanical systems can be realized.

DESCRIPTION OF THE DRAWINGS

The invention is described in detail below with reference to the following schematic drawings.

GENERAL DESCRIPTION

Before different embodiments of the present invention are described, their basic elements are addressed.

Cantilevers:

Cantilevers are well known micromechanical elements which are easy to make. Existing semiconductor fabrication processes can be employed. In essence, the techniques of micromachining are employed to create discrete cantilevers and arrays of cantilevers. If complicated structures are required, a technique called focussed ion-milling can be used. This technique is not well suited for mass-fabrication. In this technique, the substrate to be worked on is enclosed in a vacuum chamber at a base pressure of about $2.3 \times 10^{-6}$ mnbar. From an ion source, gallium (ga) ions are accelerated to by a high voltage (10–30 kV) and focussed on the target. A current of 12–300 pA is used to erode the material at the target spot. The efficiency of the process can be enhanced by directing a stream of chloride molecules to a target area. All different kind of micromechanical structures can be comfortably produced by applying this method. The equipment for focussed ion milling is commercially available.

When dimensioning cantilevers, one has to take into account specific parameters of the material used as substrate in which the cantilevers are formed. Usually, cantilevers and cantilever arrays are made by etching away portions of a silicon substrate, the substrate being (100) or (111) oriented.

(100) oriented silicon could for example be wet etched using ethyl diamine pyrocatechol or KOH solutions. Wet etching techniques are generally dependent on crystallographic orientation of the substrate, e.g. (100) oriented silicon shows a very low etch rate of the (111) plane, leading to a good etch stop along the (111) axis which generates well defined etch planes with 54.7° angles from (100). An alternative approach makes use of dry etching techniques, e.g. reactive-ion beam etching (RIE), chemically assisted ion beam etching, or microwave assisted plasma etching. In particular the RIE techniques are well suited for batch fabrication of single devices or arrays. The above mentioned focussed ion-milling technique is yet another way to make cantilever structures. Depending on process conditions, deep and anisotropic structures can be obtained leading to excellent dimensional control. Masks can be employed to define the structures to be etched. The cantilevers used may have any shape that can be obtained by photolithography and etching as well as focussed ion milling. The cross-sectional shape could for example be rectangular, round, elliptical, or polygonal.

Figure 1:
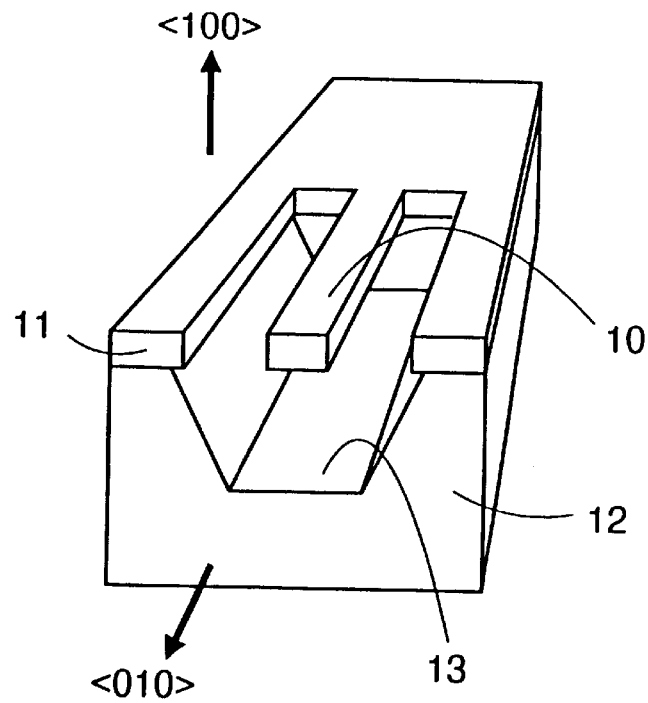
FIG. 1 shows a perspective view of a cantilever, in accordance with the present invention.

A cantilever 10, which might be used in connection with the present invention, is illustrated in FIG. 1. As shown in this Figure, there is a substrate 12 which is covered with layer 11. This layer 11 and the substrate 12 are etched so as to form a cantilever 10. This cantilever extends into a groove 13. In the present Figure the orientation of the substrate <100> is indicated.

Also suited for the fabrication of cantilevers are other semiconducting materials, like gallium arsenide for example, as reported in "dynamic Micromechnics on Silicon: Techniques and Devices", K. E. Petersen, IEEE Transactions on Electronic Devices, Vol. ED25, No. 10, 1978, pp. 1241–1249.

By suitable design of such a cantilever one obtains a micromechanical member being sensitive to a certain frequency. Choosing the right shape, length and material one obtains a member which starts to strongly vibrate (oscillate) if a force, e.g. an acoustic signal, with a particular frequency of sufficient amplitude (strength) is applied. The oscillation might as well be excited by acoustical or ultrasonic sound-waves in the substrate carrying the cantilevers. An oscillation may also be mechanically stimulated.

According to the present invention, the resonance frequency of a cantilever is chosen to approximately match the frequency which is to be detected by this particular cantilever. The first mechanical resonance can be calculated from $$f_R = 0.162 \frac{t}{l^2} \sqrt{\frac{E}{\rho} \kappa} \qquad (1)$$

where κ is a correction factor (close to one) depending on the density of the cantilever material, Young's modulus E (For thin $SiO_2$; $E=6.7 \times 10^{10} N/m^2$), and other structural details. l is the cantilever length, t the cantilever thickness, p the density. The highest resonant frequency observed so far with simple silicon cantilevers is about 1.25 MHz, see "Silicon as Mechanical Material", K. E. Petersen, Proceedings of the IEEE, Vol. 70, No. May 5, 1982, p. 447. The human ear is sensitive to frequencies up to 20000 Hz, which is about 60 times less than the frequencies that can be detected with todays micromechanical cantilevers.

Figure 2:
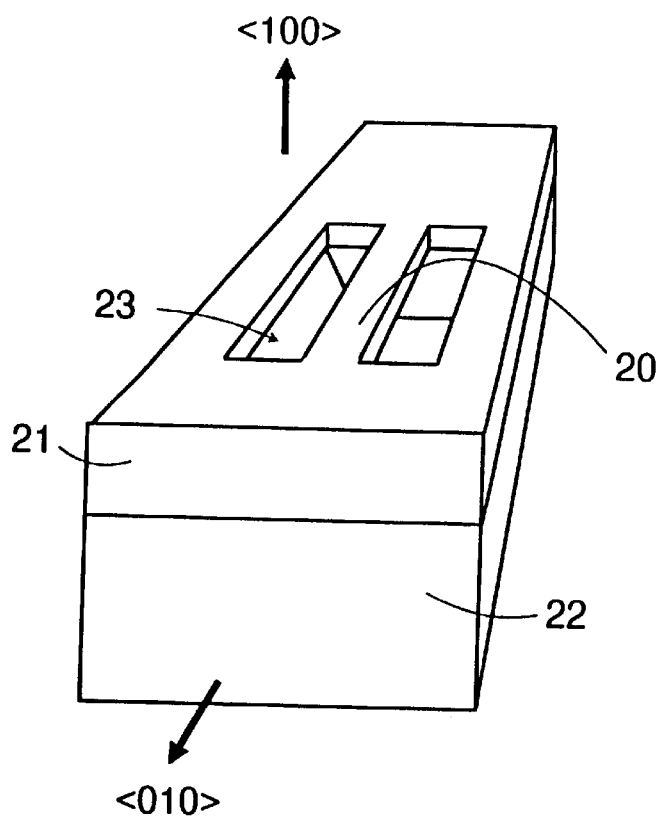
FIG. 2 shows a perspective view of a bridge, in accordance with the present invention.

Bridges:

A bridge is a beam that is clamped at both ends; like a guitar string. An example is illustrated in FIG. 2. There is a substrate 22 on which a layer 21 is formed. The substrate and layer are structured, e.g. by means of lithography and etching, such that a bridge 20 is formed above a groove 23. There is a differential equation which can be solved analytically resulting in an implicit force-frequency equation for the relation between the resonance frequency and the pulling force, i.e. the force leading to a given tension in the bridge. This equation can be approximated for small forces by $$f \simeq f_0 \left\{ 1 + 0.3 \left[\frac{l}{t}\right]^2 \frac{F}{Ebt} \right\}^{1/2} \qquad (2)$$

with f the loaded resonant frequency, $f_0$ the unloaded resonant frequency, F the pulling force, E the Young's modulus, l the length of the bridge, t its thickness and b its width. The above equation (2) is useful to calculate properties of the bridge, such as its sensitivity. The exact shape of such a bridge, if used in an acoustic detector according to the present invention for example, must be chosen with care taking into account the way an acoustic wave or other force acts on the clamped beam. Further details are for example given in "Resonating Silicon Beam Force Sensor", F. R. Blom et al., Sensors and Actuators, 17, 1989, pp. 513–519.

Figure 3:
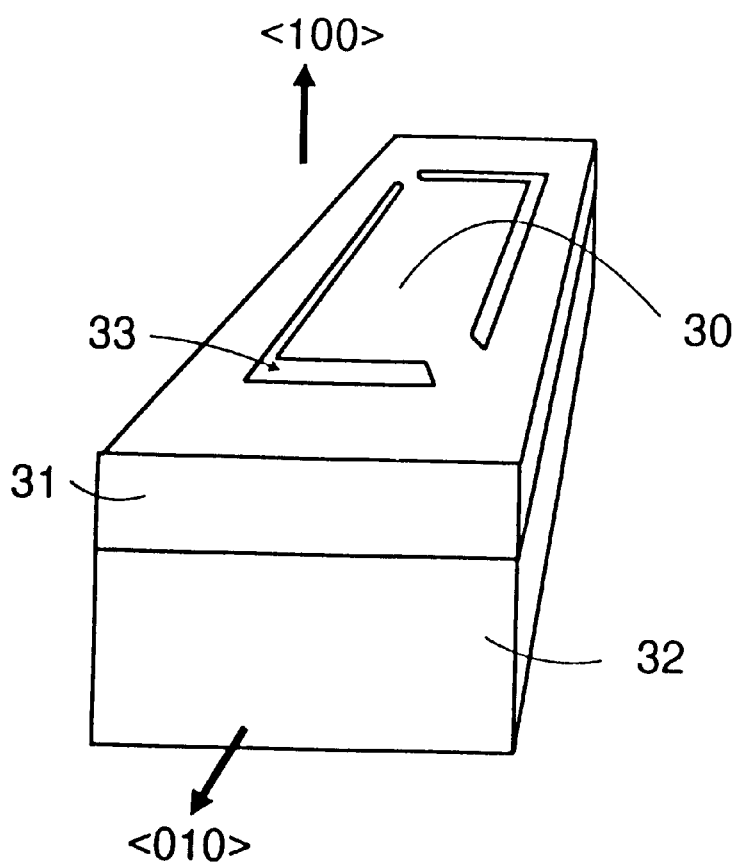
FIG. 3 shows a perspective view of a membrane, in accordance with the present invention.

Membranes:

Instead of employing a bridge, as described above, a membrane-like micromechanical member 30, being clamped at two or more corners, can be used. An example is given in FIG. 3. This membrane 30 is formed by appropriate structuring of a substrate 32 and covering layer 31. Underneath the membrane 30 there is an etch groove 33. The following equation can be used in case of a square membrane clamped at two corners to calculate the resonant frequency:

$$f \simeq f_0 \sqrt{1 + \frac{(\sigma_r + \sigma_a)(1 - v^2)}{4.417 E} \left(\frac{a}{t}\right)^2} \qquad (3)$$

where $f_0$ is the fundamental resonant frequency without in-plane stress, E is the Young's modulus, v is Poisson's ratio, t is the membrane thickness, and a is the length of the side of the membrane. Further details are given in "Modulation of Micromachined-Microphone Frequency Response Using an On-Diaphragm Heater", R. P. Ried, et al., DSC-Vol. 46, Micromechanical Systems, ASME (American Society of Mechanical Engineers) 1993, pp. 7–12.

All of the above elements, i.e. cantilevers, bridges and membranes are herein referred to as micromechanical members, micromechanical oscillators, or oscillating members. The shape of the above micromechanical members can be optimized to match certain needs, e.g. by providing:

1. an additional proof mass at the end of the cantilever (extended end mass),
2. sections which are wider than others to increase sensitivity,
3. an appropriate cross-section, and so on.

It is interesting to note that the above bridges and membranes are well suited as detectors for high frequencies. The cantilevers can be folded, e.g. like a spiral, to obtain members being sensitive to low frequencies.

Arrays of Micromechanical Members:

The above members can be arranged next to each other such that arrays of micromechanical members are obtained. A wide variety of combinations and arrangements are conceivable. Such arrays can be made with high accuracy and reproducibility. When properly designing an array, it can be mass-produced at low cost and with high yield.

According to the present invention, the above micromechanical members and the resonance frequency of each such member needs to be chosen to obtain an element being sensitive to a certain frequency. In order to avoid resonance frequency shifts due to physical and chemical interactions of the micromechanical members with the surrounding environment, e.g. mass loading, dust, water adsorption, corrosion and so forth, it is advantageous to provide for an appropriate encapsulation of each of the micromechanical members or the whole array. Under certain circumstances, it is recommended to place the micromechanical members in a housing which is evacuated. This does not only prevent contamination of the members, but also leads to a high mechanical quality factor. To achieve this, such a member might for example be placed in a microcavity. In certain cases it is important to prevent that a particular micromechanical member is directly acted upon by an external force caused by an acoustic signal, for example. There are different means which can be employed to prevent that a particular micromechanical member is stimulated in an undesirable manner. The respective micromechanical member may be rotated, e.g. by 90° such that it swings perpendicular to those members which are allowed to be stimulated by a force, such as an acoustic signal for example. The sensitivity as to acoustic signals, for example, can be reduced by reduction of the surface size which functions as target for the acoustic signal. Last but not least, a micromechanical member can be shielded or encapsulated in a housing. It is also possible to provide means for mechanical or electro-static damping. Cantilevers exposed to an attractive electro-static (or magnetic) force have the resonant frequencies lowered.

Depending on the design of the micromechanical member and the housing or cavity encapsulating said member, the mechanical quality factor Q can be lowered by introducing a gas (please note that the resonant frequency is in inverse proportion to Q, in first order). Stiffening of the micromechanical member leads to an increasing resonant frequency, whereas mass loading leads to a reduced resonant frequency. These effects can be used to fine-tune each of the micromechanical members. It is possible, for example, to place one or several members in a cavity which can be filled with an appropriate gas to achieve a damping effect. An array of micromechanical members might have several such cavities, each of which can either be evacuated, or filled with a gas. Normally, a gas pressure below 1 m bar does not lead to a significant shift of the resonant frequency, however, it is to be noted that the actual effect depends on the size of the cavity or housing, the shape, material and other parameters of the micromechanical member, and on the kind of gas introduced.

Mass loading can also be used to shift the resonant frequency, e.g. to level out fabrication variations. The problem with mass loading is that mass can only be added but not easily removed. However, certain gases condense onto the oscillators (like water vapor). This adds mass. By heating them up, the gas (liquid) gets desorbed, i.e. the mass can be removed again. In a closed box this effect is reversible. Little droplets of a resin, or thin oxide layers can for example be used to provide for an additional load of a micromechanical member. It is envisaged that focussed ion milling allows to remove mass of a particular cantilever, but this is a very complex and expensive.

Pump Oscillators:

In addition to the passive oscillating members addressed above, there are 'active' micromechanical members required, which are driven such that they oscillate at a certain frequency. These 'active' micromechanical members are hereinafter referred to as pump oscillators.

Such a pump oscillator may comprise a cantilever and an actuator being arranged such that the actuator stimulates an oscillation of the cantilever at a pump frequency fp. In case of a piezoelectric actuator, a suited electrical drive signal puts the actuator into motion which in turn stimulates an oscillation of the cantilever. Provided that more than one actuator is employed, a complex oscillation behavior of the cantilever can be obtained. The free end of the pump oscillator may perform a circular movement, for example. Examples of typical actuators are given below. For sake of simplicity, these actuators are not shown in the drawings.

Actuators:

An 'active' micromechanical member, such as a pump oscillator, comprises an actuator stimulating an oscillation.

Exemplary oscillation schemes which can be achieved with an integrated piezoelectric actuator, also referred to as transducer, are depicted in FIGS. 34–37 of the published PCT patent application WO 89/07256.

Other kind of actuators and examples of oscillating members are known in the art. In the article "Silicon Micromechanics: Sensors and Actuators on a Chip", R. T. Howe et al., IEEE Spectrum, July 1990, pp. 29–35, for example, microvibrating beams are addressed.

Idle Oscillators:

In some cases, so-called 'idle oscillators' are needed. Such an idle oscillator is a micromechanical member whose resonance frequency fi depends on the pump frequency fp of the pump oscillator and the resonance frequency f3 of the oscillating member whose losses are to be compensated. Such an idle oscillator has a resonance frequency fi=fp−f3. The idle oscillator serves the purpose of reflecting vibrational energy at the idle frequency fp−f3 back into the amplifier circuit. This back-reflection of energy is needed in order to achieve amplification at frequency f3.

Driving Circuitry:

Certain means, including driving circuitry, and an appropriate wiring is required. To make these means one can employ existing tools and processes common to the semiconductor and solid-state industries. The driving electronics may be integrated into the micromechanical structures claimed and disclosed herein.

Linear and Non-linear Coupling:

According to the present invention, two or more micromechanical members have to be coupled in a linear and/or non-linear manner.

The expression 'linear coupling element' is meant to cover any kind of means suited to provide for a linear superposition of two oscillations. A simple linear coupling element is a micromechanical bridge between two cantilevers, as addressed in connection with FIG. 6.

A non-linear coupling element, as hereinafter used, is an element suited to couple two or more micromechanical members such that the movement of a first of said members is transferred into a second of said micromechanical members in a non-linear manner. The coupling by a non-linear coupling element may be quadratic or cubic, for example. Non-linear coupling can not only be achieved by means of micromechanical elements as outlined below:

Non-linear coupling can, for example, also be achieved by means of a fluid with high viscosity surrounding the micromechanical members. The etch groove (cavity) underneath the micromechanical members might be designed such that it provides a container for a fluid, the members being placed in this groove such that they are partially or totally enclosed by the fluid. Furthermore, the gap needs to be designed such that the fluid provides for an interaction between the two cantilevers.

Likewise, a narrow gap, filled with a suited gas, between two micromechanical members can be employed as non-linear coupling element.

One can make use of electrostatic non-linear coupling elements. By providing the micromechanical members with appropriate electrodes, the force induced when applying a voltage between these electrodes leads to a non-linear coupling of the respective members. One advantage of this approach is that the coupling efficiency, i.e. the spring constant, can be adjusted by varying the voltage applied.

Any other means that can be used to couple micromechanical members in a non-linear manner are suited as well. It is clear that any combinations of the above can also be used.

The linear as well as non-linear coupling elements, according to the present invention, may be formed together with the oscillators. Likewise, one might utilize coupling elements of a material other than those of the oscillators which are solder bonded to the oscillators, for example.

Figure 9:
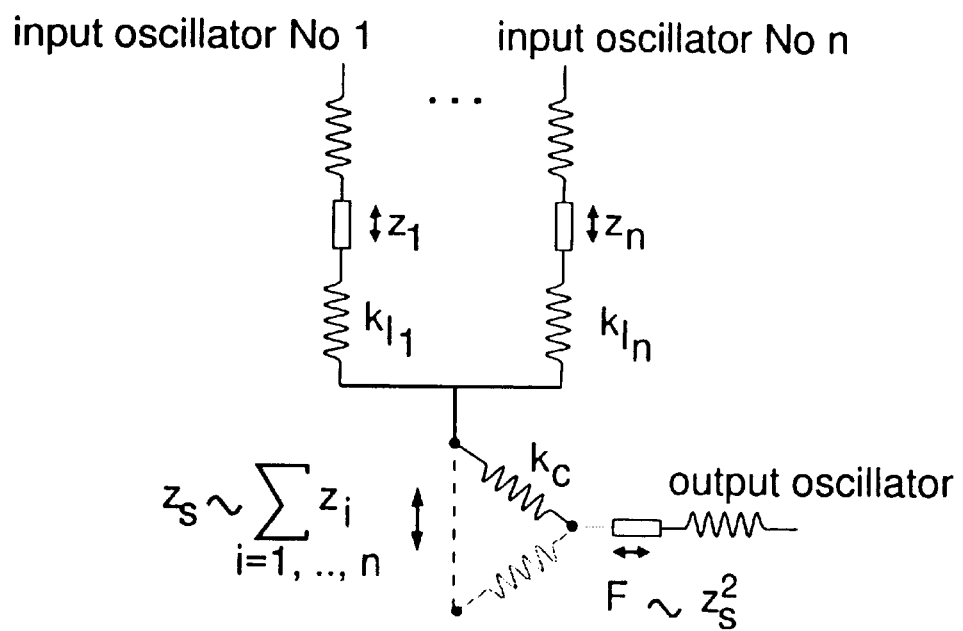
FIG. 9 is a schematic illustration used to explain an implementation of a non-linear coupling element.

The purpose of a non linear coupling element is to combine two or more input signals (i.e. oscillator vibrations) to produce an output signal that is not a simple additive superposition of the former. By the non linear action of the coupler, frequency mixing is obtained meaning that additional signals are created in the output channel with frequencies corresponding to sums and differences of integer multiples of the respective input frequencies. Non-linear effects in a system of coupled oscillators are usually obtained by driving the system at large amplitudes and constricting the motion of a linear coupling element by mechanical stops. An alternative way of realizing a non-linear coupling between oscillators is shown in FIG. 9, Here, input oscillators (1 through n) which are linearly coupled by springs ($k_{In}$) and the output oscillator vibrate in orthogonal directions. An additional spring, $k_c$, couples the output oscillator to the linear input coupler. Because of the orthogonality of the vibrations the output oscillator is excited by a driving force F that is proportional to the square of the sum $Z_s$ of the input vibration amplitudes $Z_n$. By proper design the non linear coupling of this system can be effective for small vibration amplitudes. Furthermore, the system is also favorable in terms of efficiency and reliability as all components are operating within their normal linear elastic performance regime.

Figure 4:
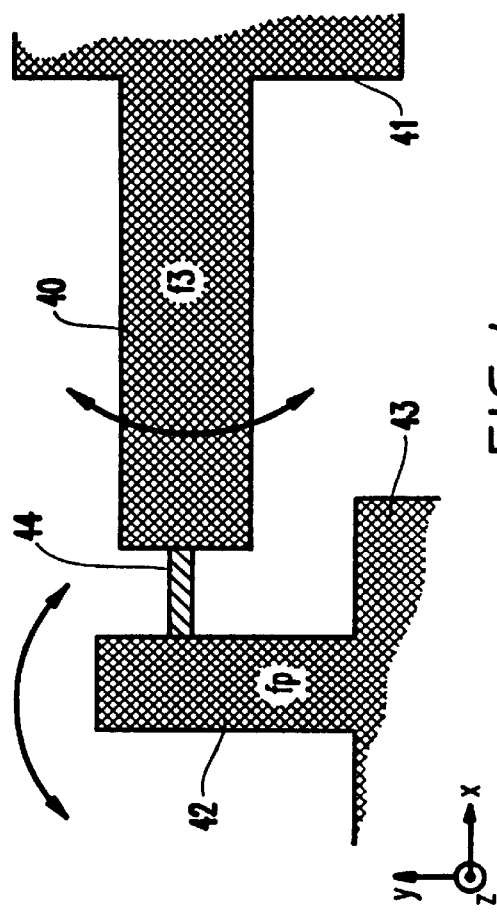
FIG. 4 is a schematic top view of a first embodiment of the basic building block, according to the present invention.

A first embodiment of the present invention is illustrated in FIG. 4. Shown is a micromechanical system which comprises an oscillating member 40 oscillating in the x-y plane at a frequency f3, as indicated by an arrow. This oscillating member 40 is formed in a substrate 41. The oscillation of this oscillating member 40 would stop after a short period of time because of losses. It is an object of the present invention to provide means which compensate these losses. In order to achieve this, a micromechanical pump oscillator 42, formed in a substrate 43, is provided. The pump oscillator is driven such that it oscillates at a frequency fp (with fp>f3). In the present example, it also oscillates in the x-y plane, but perpendicular to the oscillating member's oscillation. The pump oscillator 42 is coupled to said oscillating member 40 via a non-linear coupling element 44 such that energy from said pump oscillator 42 is transferred into the oscillating member 40 via said non-linear coupling element 44. I.e., the pump oscillator 42 serves as pump source or pump battery. Basically, there are two different states. 1) If the oscillating member 40 does not oscillate; the energy transferred from said pump oscillator 42 into said oscillating member 40 is negligible such that the oscillating member remains silent. 2) If the oscillating member 40 oscillates at frequency f3, the losses are compensated by the energy provided by the pump oscillator 42. Depending on the amount of energy transferred from the pump source into the oscillating member 40, its oscillation may even be amplified. In the present embodiment, there is no need for an idle oscillator, because the two oscillators 40 and 42 are designed such that the following equation is satisfied: fp=2×f3.

Figure 5:
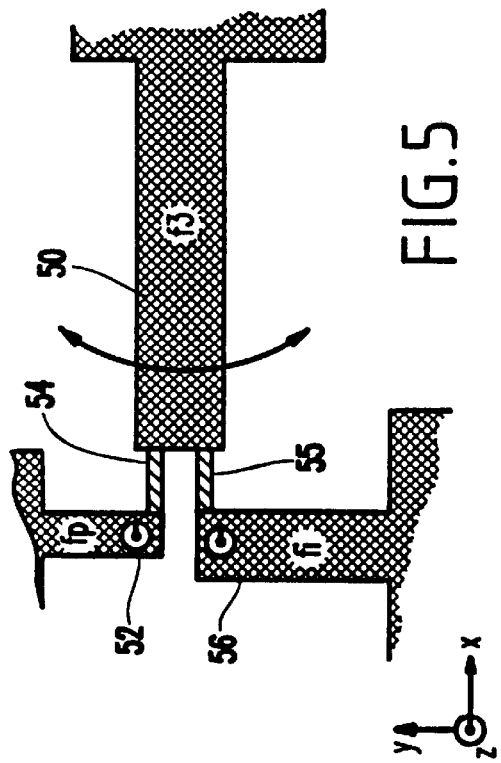
FIG. 5 is a schematic top view of a second embodiment of the basic building block, according to the present invention.

A second embodiment, according to the present invention, is given in FIG. 5. As in FIG. 4, a micromechanical system is shown, which comprises an oscillating member 50 and a pump oscillator 52. The pump oscillator 52 is coupled via a non-linear coupling element 54 to said oscillating member 50 such that losses are compensated. The second embodiment is more general than the first embodiment, because, except for the fact that fp>f3, no other restrictions are given. In order for such a system to operate properly, an idle oscillator 56 is needed. In the present example, this idle oscillator 56 is coupled via a separate non-linear coupling element 55 to said oscillating member 50. The idle oscillator has to be designed such that it oscillates at a frequency fi=fp−f3. It is to be noted, that the idle and pump oscillators 56 and 52 both oscillate in the y-z plane, whereas the oscillating member 50 oscillates in the x-y plane.

From this more general second embodiment, the first embodiment can be derived. If fp=2×f3, the above equation is only satisfied, if fi=f3. I.e., in case that the pump oscillator is operated at a frequency fp=2×f3, no idle oscillator is required.

Figure 6:
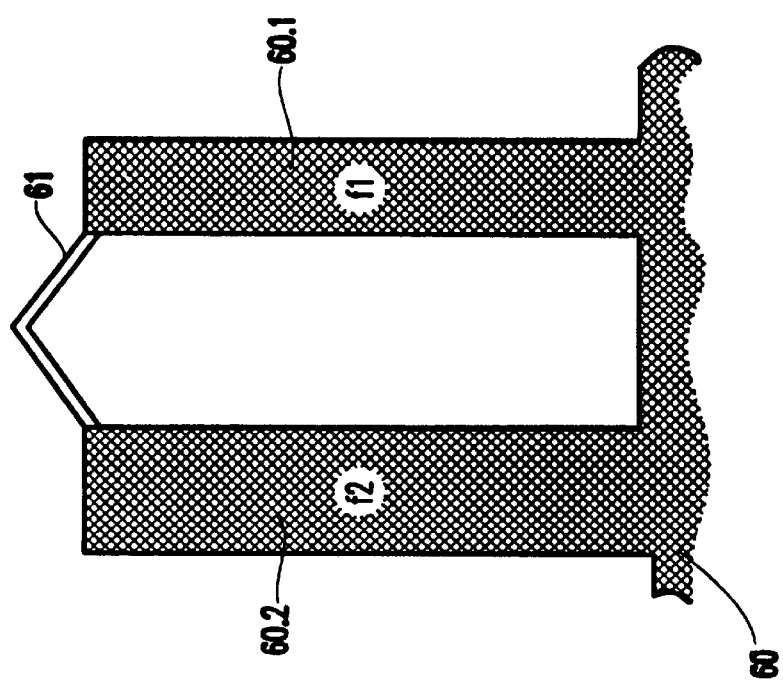
FIG. 6 is a schematic top view of mechanical system for linear superposition of two oscillations, as described and claimed in the co-pending patent application PCT/IB 95/00817.
Figure 7:
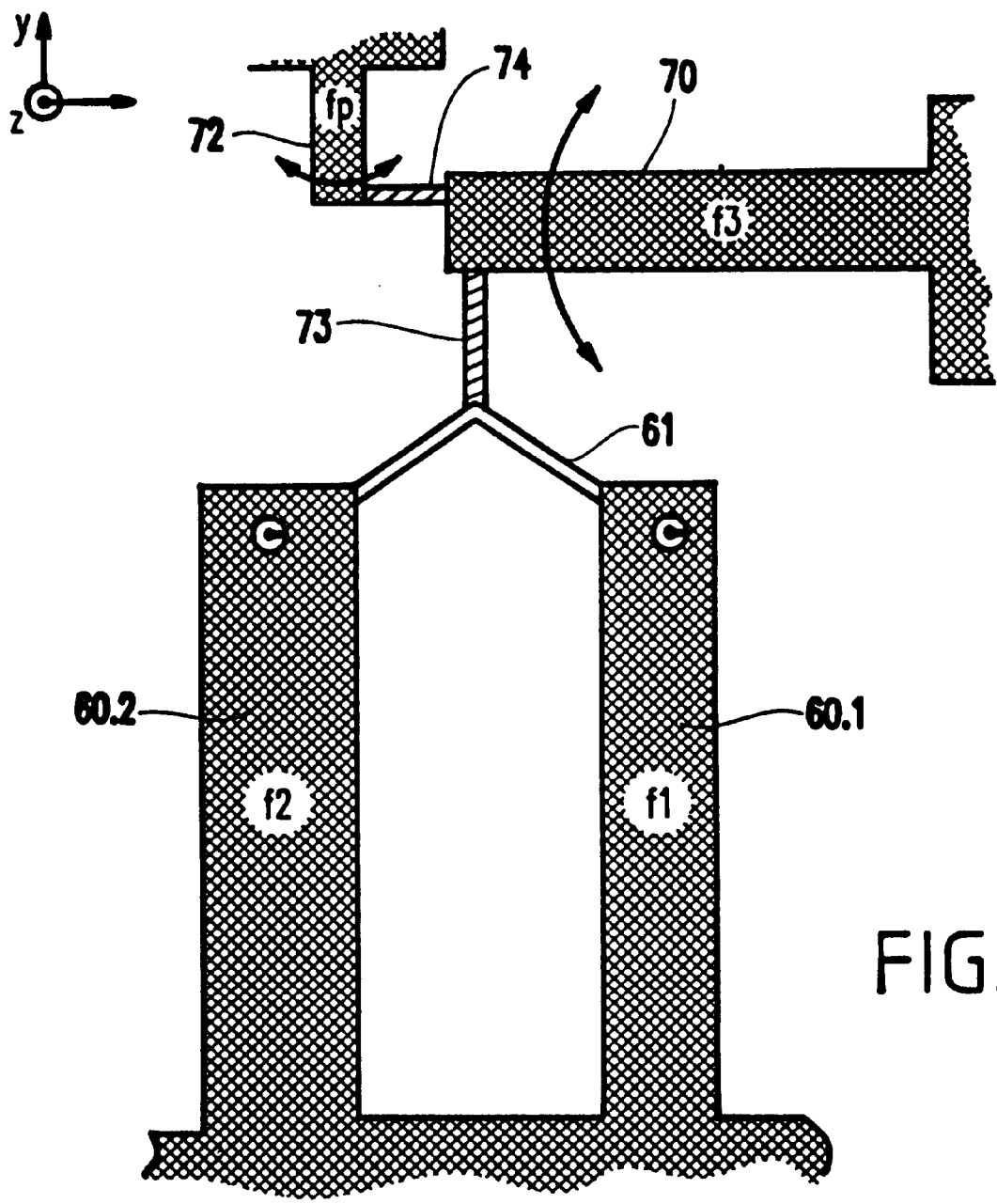
FIG. 7 is a schematic top view of the third embodiment of the present invention.

As described and claimed in the co-pending patent application PCT/IB 95/00817, two oscillations f1 and f2 can be mechanically superposed by means of a linear coupling element 61, as illustrated in FIG. 6. This co-pending patent application and the details described therein are herewith incorporated by means of reference. In FIG. 6, two cantilevers 60.1 and 60.2 are shown. These two cantilevers 60.1 and 60.2 are formed in a substrate 60. The first cantilever 60.1 has a resonance frequency f1 and the second cantilever 60.2 has a resonance frequency f2. Both cantilevers are interconnected at their free ends by means of a linear coupling element 61. If the first cantilever 60.1 is stimulated such that it oscillates at frequency f1 and the second one is stimulated such that it oscillates at frequency f2, a linear superposition of the two frequencies occurs at at the linear coupling element 61. One may now couple this micromechanical system via a non-linear coupling element 73 to an oscillating member 70, as illustrated in FIG. 7. If the resonance frequency f3 of this oscillating member 70 matches one of the frequency terms of the linear superposition at the linear coupling element 61, it is stimulated via the non-linear coupling element 73 and starts to oscillate at the frequency f3. The micromechanical system comprising the elements 60.1, 60.2, 61, 70 and 73 operates like an AND gate where a signal f3 is provided if the two signals f1 and f2 are 'detected'. Such a mechanical AND gate, as addressed and claimed in the above mentioned patent application, has the disadvantage that the oscillation of the oscillator 70 runs dead within a short period of time because of losses. If one now couples the oscillating member 70 via a non-linear coupling element 74 to a pump oscillator 72 which oscillates at a frequency fp=2×f3, these losses are compensated. I.e., a micromechanical AND gate with loss compensation is provided. As already mentioned, it is even possible to amplify the oscillation such that AND gates with gain can be realized. This is possible only if the amount of energy transferred into the oscillating member 70 overcompensates the losses. The AND gate with loss compensation, given in FIG. 7, is the third embodiment of the present invention.

Figure 8:
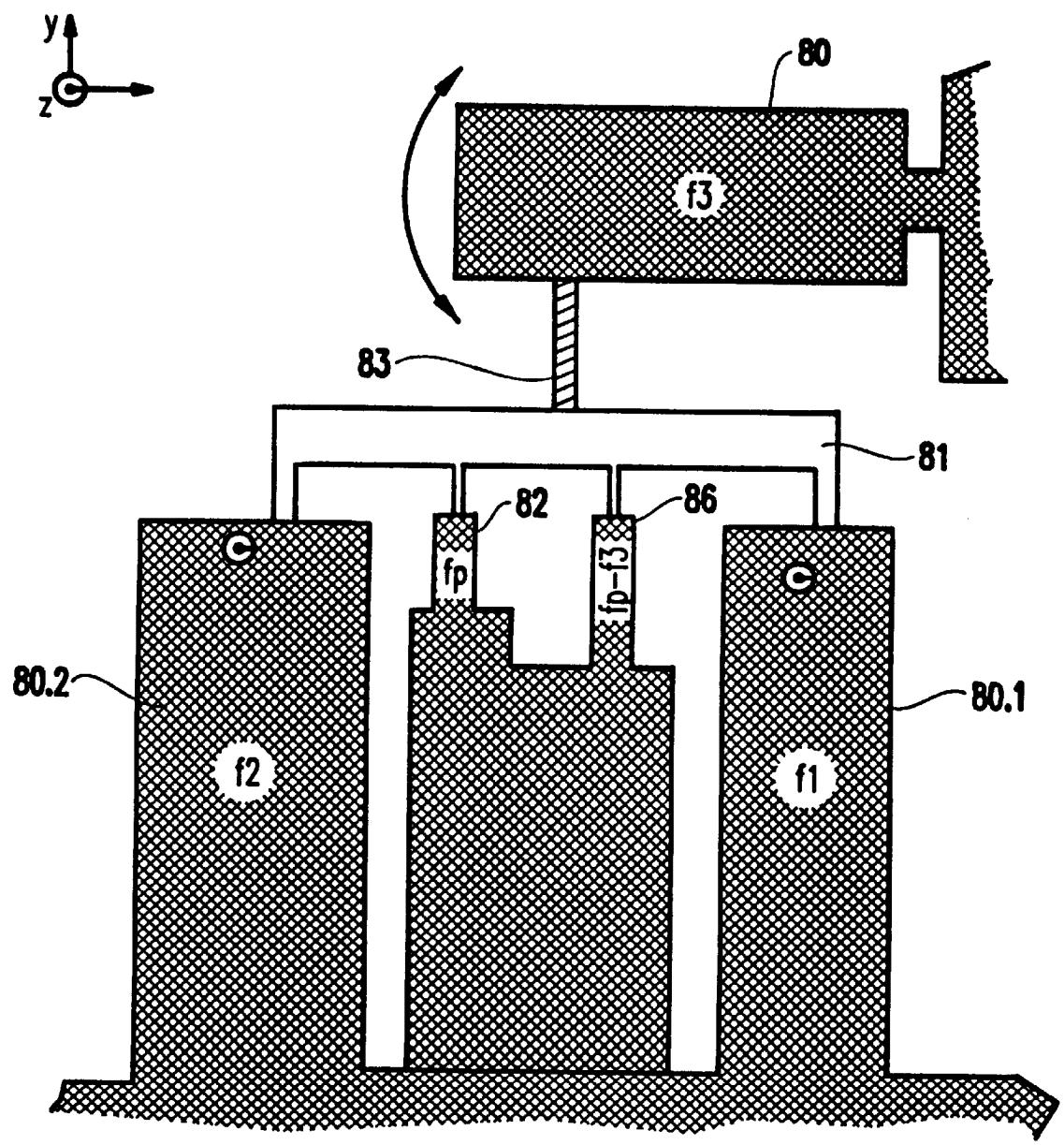
FIG. 8 is a schematic top view of the fourth embodiment of the present invention.

Another embodiment is illustrated in FIG. 8. The micromechanical system illustrated in this Figure comprises a first cantilever 80.1 which may be stimulated to oscillate at frequency f1. A second cantilever 80.2 may oscillate at a frequency f2, if being stimulated. These two cantilevers 80.1 and 80.2 are coupled via a linear coupling element 81. Additionally, a pump oscillator 82 and an idle oscillator 86 are coupled to the same linear coupling element 81. An oscillating member 80 is connected via a non-linear coupling element 83. This member 80 starts to oscillate at its resonance frequency f3, if the first and second cantilevers 80.1 and 80.2 oscillate at frequencies f1 and f2, respectively. Via the same linear and non-linear coupling elements 81 and 83, energy is transferred into the oscillating member 80 such that at least its the losses are compensated. If the oscillation frequency fp of the pump oscillator 82 does not satisfy the equation fp=2×f3, an idle oscillator 86 is needed. This idle oscillator 86 operates at frequency fi=fp−f3.

The idle oscillator itself may also serve as signal oscillator, i.e., the output signal may directly be taken from the idle oscillator. This allows to realize another implementation of the present invention.

It is to be understood that there are many different arrangements of the basic elements possible. Depending on the kind of linear and non-linear coupling element used, and the particular range of frequencies chosen, the whole micromechanical system can be integrated onto a common substrate.

Based on the different building blocks addressed so far, namely the micromechanical system for linear superposition of two (or more) oscillations (see FIG. 6, for example),
the AND gate (see FIG. 7),
the AND gate with loss compensation (see FIG. 7), and
the AND gate with gain, more complex micromechanical systems can be realized. In the following, some examples are given.

An acoustic signal processing system can be made using the above mentioned elements. Some details of such acoustic signal processing systems are given in the above mentioned patent application. Several building blocks can be easily connected to each other if the losses are compensated, according to the present invention. This allows to recognize sound or complex frequency patterns. Part or all of the processing can be done mechanically. Using the above building blocks, and in particular the means for loss compensation and amplification, speech recognition systems, being different from what is known so far, microphone assemblies, hearing aids, noise eliminators and the like can be realized.

By means of the above building blocks it is even possible to realize micromechanical calculators or computers. The above building blocks are slower than the electronic components used to make conventional computers, but if one uses the mechanical building blocks for highly parallel operation this disadvantage can be easily overcome. In general terms, such a micromechanical system serving a calculator or computer exhibits a particular output state (oscillation) depending on a number of input states (oscillations). If the above building blocks are arranged in a three-dimensional structure, highly complex operations can be carried out in a small volume.

The present mechanical signal processing systems have different advantages. They are reliable, easy to make, cheap, insensitive to electromagnetic disturbance, such as electromagnetic shock waves after a nuclear strike, just to mention some advantages.

What is claimed is:

1. Micromechanical signal processing system, comprising;
   an oscillating member designed to oscillate at a first frequency,
   a micromechanical pump oscillator being driven so as to oscillate at a second frequency, with said second frequency being greater than said first frequency, and
   a non-linear coupling element coupling said micromechanical pump oscillator to said oscillating member, being arranged such that energy from said micromechanical pump oscillator is transferred via said non-linear coupling element into said oscillating member to compensate for losses of said oscillating member oscillating at the first frequency.

2. The signal processing system of claim 1, further comprising an idle oscillator being coupled in a non-linear manner to said oscillating member, said idle oscillator being designed to oscillate at a third frequency which is substantially equal to a difference between said second frequency and said first frequency.

3. The signal processing system of claim 1, further comprising means for mechanical stimulation of said oscillating member such that said oscillating member starts to oscillate at the first frequency.

4. The signal processing system of claim 3, wherein said means for mechanical stimulation comprises a first cantilever designed to oscillate at a fourth frequency, a second cantilever designed to oscillate at a fifth frequency, and a linear coupling element for linear superposition of the oscillations of said first and second cantilevers.

5. The signal processing system of claim 1, wherein said micromechanical pump oscillator comprises driving means for actively stimulating its oscillation at a second frequency.

6. The signal processing system of claim 5, wherein said driving means comprises a piezoelectric actuator which stimulates an oscillatory movement of said micromechanical pump oscillator if driven by a suited signal.

7. The signal processing system of claim 5, wherein said driving means comprises at least two piezoelectric actuators which stimulate a circular movement of said micromechanical pump oscillator if driven by suited signals.

8. A signal processing system comprising at least one micromechanical signal processing system according to claim 1.

9. The signal processing system of claim 8, being designed for processing and/or detecting acoustic signals.

10. The signal processing system of claim 8, being designed for processing mechanical signals.

11. Micromechanical computer or calculator comprising several micromechanical signal processing systems according to claim 1 being arranged and interconnected such that a particular output state is exhibited if a number of input states are detected.

12. The signal processing system of claim 2, further comprising means for mechanical stimulation of said oscillating member such that the oscillating member starts to oscillate at the first frequency.

13. The signal processing system of claim 12, wherein said means for mechanical stimulation comprises a first cantilever designed to oscillate at a fourth frequency, a second cantilever designed to oscillate at a fifth frequency, and a linear coupling element for linear superposition of the oscillations of said first and second cantilevers.

* * * * *